United States Patent
Takizawa et al.

(10) Patent No.: US 7,832,353 B2
(45) Date of Patent: Nov. 16, 2010

(54) SEMICONDUCTOR MANUFACTURING APPARATUS EQUIPPED WITH WAFER INSPECTION DEVICE AND INSPECTION TECHNIQUES

(75) Inventors: Masahiro Takizawa, Nagaoka (JP); Teruhide Nishino, Yokohama (JP)

(73) Assignee: ASM Japan K.K., Tokyo (JP)

( * ) Notice: Subject to any disclaimer, the term of this patent is extended or adjusted under 35 U.S.C. 154(b) by 8 days.

(21) Appl. No.: 12/198,004

(22) Filed: Aug. 25, 2008

(65) Prior Publication Data

US 2010/0049353 A1 Feb. 25, 2010

(51) Int. Cl.
*B05C 11/00* (2006.01)
(52) U.S. Cl. .............................. 118/712; 257/E21.521; 257/21.53
(58) Field of Classification Search ................ 29/25.01; 257/E21.521, E21.53; 118/712
See application file for complete search history.

(56) References Cited

U.S. PATENT DOCUMENTS

| | | | |
|---|---|---|---|
| 6,609,869 B2 | 8/2003 | Aggarwal et al. | |
| 6,876,191 B2 | 4/2005 | de Ridder et al. | |
| 6,902,647 B2 | 6/2005 | Hasper | |
| 7,018,504 B1 | 3/2006 | Raaijmakers et al. | |
| 7,397,550 B2 * | 7/2008 | Hackney et al. | 356/237.1 |
| 2002/0038794 A1 * | 4/2002 | Canella et al. | 219/121.82 |
| 2006/0154385 A1 | 7/2006 | Aggarwal | |
| 2008/0256131 A1 * | 10/2008 | Shimohara | 707/104.1 |

FOREIGN PATENT DOCUMENTS

JP    2005-286102    10/2005

* cited by examiner

*Primary Examiner*—Michelle Estrada
(74) *Attorney, Agent, or Firm*—Knobbe, Martens, Olson & Bear LLP

(57) ABSTRACT

A semiconductor manufacturing apparatus includes a processing unit for processing at least one wafer; a loading/unloading unit for loading/unloading at least wafer; an input/output chamber for taking in a processed wafer from the processing unit and taking out the processed wafer to the loading/unloading unit, and taking in a unprocessed wafer from the loading/unloading unit and taking out the unprocessed wafer to the reaction unit; and a wafer inspection device for inspecting the processed wafer through a light transmittable top portion of the input/output chamber, through which light is transmittable, while the processed wafer is temporarily placed in the input/output chamber.

14 Claims, 6 Drawing Sheets

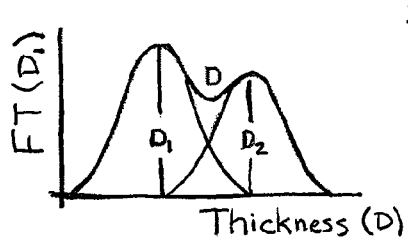
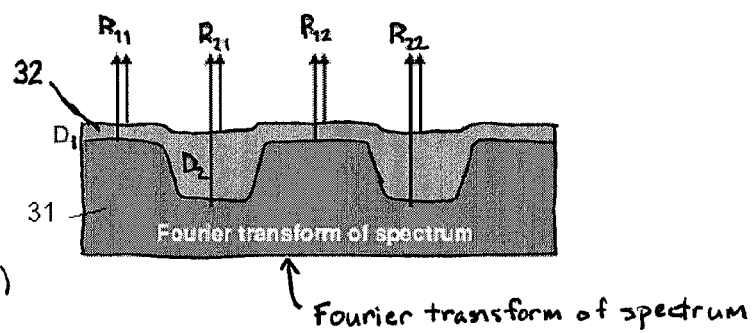
Fig. 2     Fig. 3
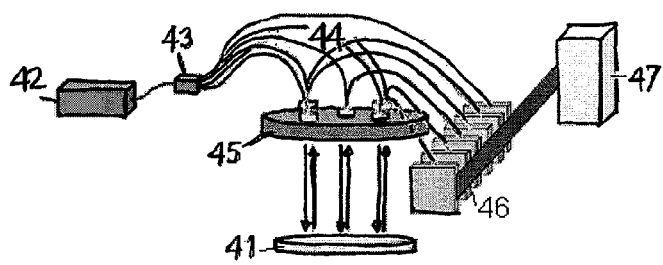
Fig. 4

SEMICONDUCTOR MANUFACTURING APPARATUS EQUIPPED WITH WAFER INSPECTION DEVICE AND INSPECTION TECHNIQUES

BACKGROUND

1. Field of the Invention

The present invention relates to a semiconductor manufacturing apparatus equipped with a wafer inspection module.

2. Description of the Related Art

In semiconductor wafer production, inspecting the semiconductor wafers that have been manufactured by the semiconductor manufacturing apparatus is an important process. For example, with a plasma CVD apparatus the thickness of the thin film deposited on the semiconductor wafer is important. If this film thickness becomes irregular within the semiconductor wafer plane, the produced chip will have different characteristics in different parts of the same semiconductor wafer.

Traditionally, a semiconductor inspection apparatus is provided separately from the semiconductor manufacturing apparatus, and the semiconductor wafers processed by the semiconductor manufacturing apparatus are transferred to the semiconductor inspection apparatus to be inspected. In the aforementioned example, a film thickness measuring system is provided separately from the plasma CVD apparatus, and this film thickness measuring system is used to measure the film thickness on the semiconductor wafers that have been processed by the plasma CVD apparatus.

The wafer production volume per unit time (throughput) and floor area occupied by the semiconductor manufacturing apparatus (footprint) have become major concerns in recent years in the field of semiconductor wafer production. As explained above, however, the semiconductor manufacturing apparatus and semiconductor inspection apparatus are two separate apparatuses and therefore a specified number of semiconductor wafers needs to be processed first, before they can be transferred to the semiconductor inspection apparatus. The time needed to transfer semiconductor wafers between the two apparatuses cannot be ignored, either. Having to use two apparatuses also increases the footprint.

One way to improve the throughput is to install in the semiconductor manufacturing apparatus a semiconductor wafer inspection chamber as a module equipped with a semiconductor wafer inspection mechanism. For example, in Japanese Patent Laid-open No. 2005-286102 a semiconductor wafer inspection chamber is connected to the handling chamber, just like the reaction chamber, to achieve improved throughput and smaller footprint.

However, this method requires semiconductor wafers, already processed in the reaction chamber, to be transferred to the semiconductor wafer inspection chamber via the handling chamber for inspection in the semiconductor wafer inspection chamber, and this increases the processing time beyond what is needed to process semiconductor wafers. Inevitably this method also increases the footprint by the semiconductor wafer inspection chamber.

SUMMARY

To solve at least one of the problems mentioned above, a semiconductor manufacturing apparatus conforming to an embodiment of the present invention is characterized in that it has a small semiconductor wafer in-line metrology module above the semiconductor wafer input/output chamber so that semiconductor wafers that have been processed in the semiconductor wafer reaction chamber are returned to the semiconductor wafer input/output chamber and then inspected while the pressure level in the semiconductor wafer input/output chamber is changed from vacuum to atmospheric pressure.

By using the aforementioned method, semiconductor wafers can be inspected without reducing at all the throughput of the semiconductor manufacturing apparatus, and this method also provides a semiconductor manufacturing apparatus that does not increase the footprint.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

FIGS. 2 and 3 show the principle of film thickness measuring method by an example semiconductor wafer inspection module employing an in situ thickness measurement system (IsTMS).

FIG. 4 is a schematic view showing a system structure of an IsTMS module for film thickness measurement.

DETAILED DESCRIPTION

Figure 1:
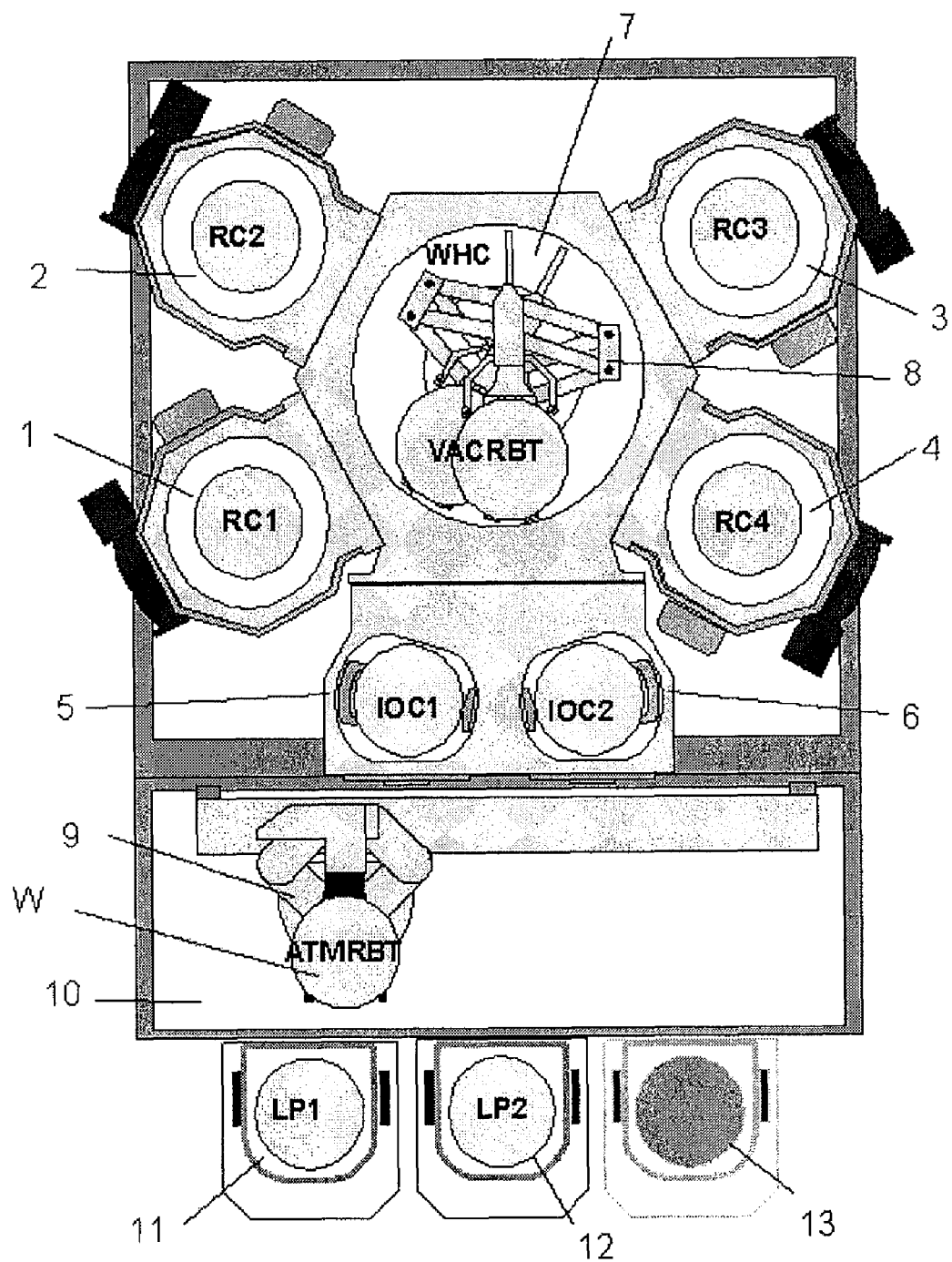
FIG. 1 is a schematic plan view showing an example of a conventional semiconductor manufacturing apparatus.

One or more of the problems described above can be solved by an embodiment wherein a semiconductor manufacturing apparatus comprises: (a) a processing unit for processing at least one wafer; (b) a loading/unloading unit for loading/unloading at least one wafer; (c) an input/output chamber for taking in a processed wafer from the processing unit and taking out the processed wafer to the loading/unloading unit, and taking in a unprocessed wafer from the loading/unloading unit and taking out the unprocessed wafer to the reaction unit, said input/output chamber having a top portion through which light is transmittable; and (d) a wafer inspection device for inspecting the processed wafer through the input/output chamber top portion, through which light is transmittable, while the processed wafer is temporarily placed in the input/output chamber.

In an embodiment, the wafer inspection device may be disposed directly or indirectly above the input/output chamber top portion through which light is transmittable.

In any of the foregoing embodiments, the wafer inspection device may be suspended above the input/output chamber top portion through which light is transmittable.

In any of the foregoing embodiments, the wafer inspection device may be an optical inspection device for optically measuring thickness of a film formed on the processed wafer.

In any of the foregoing embodiments, the wafer inspection device may be an integrated metrology module programmed to inspect the processed wafer while the pressure inside the input/output chamber changes. In an embodiment, where the input/output chamber serves as a load lock to help isolate the processing environment from the clean room, the integrated metrology module may be programmed to inspect the processed wafer while the pressure inside the input/output chamber rises from reduced pressure. In another embodiment, the integrated metrology module may be programmed to trigger inspection of the processed wafer when the processed wafer is taken into the input/output chamber from the processing unit.

In any of the foregoing embodiments, the semiconductor manufacturing apparatus may further comprise an other input/output chamber disposed next to the input/output chamber and another wafer inspection device disposed above the other input/output chamber. Alternatively, the semiconductor manufacturing apparatus may further comprise an other input/output chamber disposed next to the input/output chamber, wherein the wafer inspection device is rotatable between a first position where the wafer inspection device is right above the input/output chamber and a second position where the wafer inspection device is right above the other input/output chamber. In an embodiment, the wafer inspection device may be an integrated metrology module programmed to trigger inspection of the processed wafer when the integrated metrology module moves to the first position or the second position.

In any of the foregoing embodiments, the processing unit may comprise a wafer handling chamber connected to the input/output chamber, and at least one reaction chamber connected to the handling chamber, said wafer handling chamber being provided with a vacuum transfer robot for transferring wafers between the at least one reaction chamber and the input/output chamber.

In any of the foregoing embodiments, the loading/unloading unit may comprise at least one wafer cassette and a mini-environment may be provided between the input/output chamber and the loading/unloading unit, said mini-environment being provided with an atmospheric transfer robot for transferring wafers between the input/output chamber and the loading/unloading unit. Such mini-environments are sometimes known in the art as atmospheric front end (AFE) interfaces.

Another aspect includes a method of inspecting a processed semiconductor wafer comprising: (i) taking in a processed wafer to an input/output chamber from a processing unit under reduced pressure, said input/output chamber having a top portion through which light is transmittable; (ii) after raising the pressure inside the input/output chamber, taking out the processed wafer from the input/output chamber to a loading/unloading unit; and (iii) between steps (i) and (ii), optically inspecting the processed wafer while being temporarily placed inside the input/output chamber, by transmitting light through the top portion through which light is transmittable; and receiving reflective light through the input/output chamber top portion through which light is transmittable.

In an embodiment, step (iii) may be triggered by a signal of changing the pressure of the input/output chamber or a signal of receiving the processed wafer in the input/output chamber.

In any of the foregoing embodiments, step (iii) may be complete before the pressure inside the input/output chamber reaches a designated pressure.

In any of the foregoing embodiments, step (iii) may be performed by an integrated metrology module disposed above the input/output chamber. In an embodiment, an other input/output chamber may be provided next to the input/output chamber, wherein step (iii) further comprises rotating the integrated metrology module between a first position where the integrated metrology module is right above the input/output chamber for inspecting the processed wafer therein and a second position where the integrated metrology module is right above the other input/output chamber for inspecting the processed wafer therein. In an embodiment, step (iii) may be triggered by a signal of completing the rotation of the integrated metrology module.

In any of the foregoing embodiments, step (iii) may inspect thickness of a film formed on the processed wafer.

Still another aspect includes a method of processing a wafer comprising: (I) processing a wafer in a processing chamber; (II) transferring the processed wafer to an input/output chamber from the processing chamber and performing inspection of the processed wafer using any of the foregoing methods, and (III) transferring the inspected wafer to a loading/unloading unit, wherein when an abnormal state is detected as a result of the inspection, the processing is stopped and/or an alarm goes off.

In an embodiment, a wafer inspection device is installed in a semiconductor manufacturing apparatus for the purposes of quality control. By monitoring one or more designated characteristics of the film deposited on a wafer while the wafer manufacturing apparatus is in operation, abnormal operational conditions can be detected at an early stage so as to perform appropriate action (e.g., stopping processing and/or raising an alarm) and minimize impact on the productivity and throughput. In an embodiment, the wafer inspection device is disposed substantially or nearly co-axially with and above an input/output chamber where a wafer is temporarily placed between a reaction chamber and a load port, and performs inspection while the wafer stays in the input/output chamber as programmed so that there is no or little impact on the throughput. The input/output chamber is en route from processing chamber to the load port. Accordingly, the wafer inspection is truly "in-line" as it is conducted in the normal wafer transfer path.

Such input/output (I/O) chambers can take the form of load lock chambers with doors on either side to preserve the purity of the process environment on one side by isolating it from the clean room environment on the other side. Often such load lock I/O chambers also preserve a pressure differential between embodiment clean room (atmospheric) pressure on the load/unload side and a reduced pressure on the processing side of the tool. The illustrated process thus takes advantage of the waiting time for a wafer in the load lock chamber between loading, closing a first door, opening a second door and unloading the wafer from the load lock.

The wafer inspection device may or may not be integrated with the semiconductor-manufacturing apparatus. In an embodiment, the wafer inspection device is an in line metrology module (IMM) integrated with the semiconductor manufacturing apparatus where the IMM is disposed substantially or nearly co-axially with and above the input/output chamber. In an embodiment, the IMM and a main controller of the apparatus mutually communicate with each other. In another embodiment, the wafer inspection device is a stand-alone device disposed substantially or nearly above the input/output chamber.

The position of the wafer inspection device may be directly above the input/output chamber, i.e., the wafer inspection device and the input/output chamber may be co-axially disposed. In another embodiment, the axis of the wafer inspection device may be angled with respect to the axis of the input/output chamber or may be parallel to the axis of the input/output chamber as long as the wafer inspection device can measure a given measurement or measurements of the film deposited on a substrate while being temporarily placed in the input/output chamber. In an embodiment, the wafer inspection device may be placed on top of the input/output chamber. In another embodiment, the wafer inspection device is suspended and spaced above the input/output chamber, keeping a distance between the wafer inspection device and the input/output chamber. In an embodiment, the wafer inspection device may move or rotate and be positioned at a designated location for measuring one or more given measurements of the film deposited on a substrate while being temporarily placed in the input/output chamber. The movement or rotation can be accomplished by using robotics or any other mechanisms appreciated by one of ordinary skill in the art.

In an embodiment, the wafer inspection device may be a device for measuring one or more measurements of film deposited on a wafer, which includes thickness, density, optical characteristics, etc.

In an embodiment, the wafer inspection device may be an IMM such as an in situ thickness measurement system (IsTMS) commercially available under the trade name TRAJECTORY $T^3$ from Tevet Process Control Technologies Inc. of Pleasanton, Calif. The IsTMS uses a large-spot-size broadband Fourier-transform reflectometry (LSBFTR) method for measuring silicon nitride and silicon oxide film thickness, for example, deposited on a wafer (e.g., having shallow-trench isolation structures). In an embodiment, any other suitable integrated or stand-alone metrology technology can be employed In an embodiment, a portion of the input/output chamber facing the wafer inspection device may be made of a material such that the wafer inspection device can perform its inspection through the portion. The portion can be a lid for the input/output chamber or a window in the top of the input/output chambers. In an embodiment, the wafer inspection device may perform optical inspection and use emission of light, and the portion of the input/output chamber may be transparent so as to permit light transmission of the desired wavelength for the metrology module through the portion. In an embodiment, the input/output chamber has a glass window on its top through which the wafer inspection device inspects the wafer inside the input/output chamber.

The present invention will be explained in detail with reference to embodiments and drawings which are not intended to limit the present invention.

FIG. 1 is a schematic plan view showing an example of a conventional semiconductor manufacturing apparatus which includes the following chambers (modules):

Input/output chamber 5 (IOC1), input/output chamber 6 (IOC2): Intermediate chambers for accepting and returning semiconductor wafers between the loading ports and process chamber;

Wafer handling chamber 7 (WHC): houses a robot behind the input/output chambers 5, 6 for transport of semiconductor wafers between the input/output chambers and the process chamber(s);

Reaction chamber 1 (RC1), reaction chamber 2 (RC2), reaction chamber 3 (RC3), reaction chamber 4 (RC 4): for conducting semiconductor wafer processing.

The apparatus shown in FIG. 1 further includes:

Load port 11 (LP1), load port 12 (LP2): mounting places for a semiconductor wafer storing container (e.g., a FOUP or Front Opening Unified Pod);

A third load port 13 is also shown;

Atmospheric robot 9 (ATMRBT): atmospheric transfer robot installed inside a mini-environment 10 or "atmospheric front end" (AFE);

Vacuum robot 8 (VACRBT): Vacuum transfer robot inside the wafer handling chamber 7.

In the apparatus, semiconductor wafers W are stored in semiconductor wafer storing containers, such as conventional 300-mm FOUPs, and placed on the load ports 11, 12. A semiconductor wafer W is transferred to one of the input/output chambers 5 or 6 by the atmospheric robot 9 under ambient or atmospheric pressure, and transferred from the I/O chamber to the reaction chambers 1-4 by the vacuum robot 7 under a vacuum condition, and then subjected to designated chemical processing (e.g., chemical vapor deposition or CVD) inside the reaction chambers. After the processing is complete, the semiconductor wafer W is returned to FOUP from the reaction chambers 1-4 by way of one of the I/O chambers 5 or 6 in the reverse order.

Next, the semiconductor wafer in-line metrology module (IMM) to be integrated into the apparatus is explained. FIGS. 2 and 3 illustrate the operating principles of the IMM, especially the IsTMS film thickness measuring system by TEVET. The mechanism is such that light is irradiated onto the wafer surface and the wavelength of the reflected light is examined by Fourier analysis to calculate the film thickness. In FIG. 3, reflected waves $R_1$ ($R_{11}$, $R_{12}$) and $R_2$ ($R_{21}$, $R_{22}$), each entering an area of different thickness of a film 32 formed on a wafer 31, have different wavelengths, respectively. When these wavelengths are examined by Fourier analysis, different film thicknesses, $D_1$ and $D_2$, are calculated. FIG. 3 is a schematic cross-section view of a wafer having a STI (shallow-trench isolation) structure, but the aforementioned method to calculate the thickness based on Fourier analysis of the wavelength of reflected light can be used to measure the thickness of a general film formed on a wafer, regardless of whether or not the wafer has a STI structure. In an embodiment, the irradiated light is white light covering wavelengths of 200 to 860 nm, for example, while the light source consists of UV and VIS (visible) lamps that are combined to mix two or more types of light. In an embodiment, only one type of light is required. The wavelength of irradiated light is selected as deemed appropriate based on the applicable principle of measurement.

FIG. 4 is a schematic view illustrating the structure of the IsTMS thickness measuring system by TEVET. Take note that this IsTMS thickness measuring system is cited only as one example and this embodiment is not limited to this system in any way. Light is output from a light source 42 (heavy hydrogen/halogen lamp) through a fiber cable 44, and this light is irradiated onto a semiconductor wafer 41 from an optical head 45, after which the reflected light is picked up again by the optical head 45 and spectrally differentiated into wavelengths by a spectrometer 46. The reflected light, which has been broken down into different wavelengths, is examined by Fourier analysis via a controller 47 to calculate the film thickness.

Figure 5:
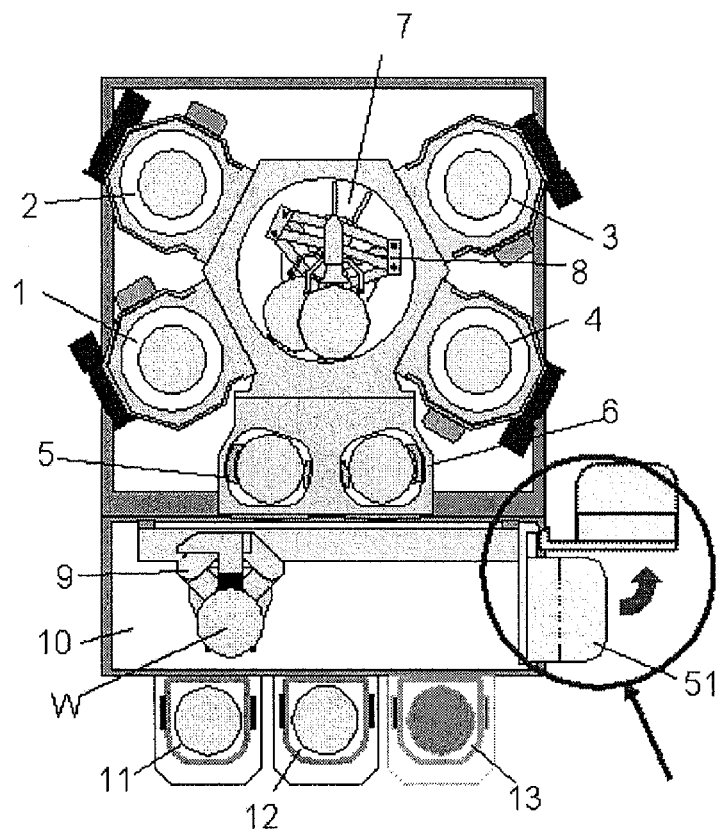
FIGS. 5 and 6 are schematic plan views showing comparative examples of integration locations of the IsTMS module in a semiconductor manufacturing apparatus.
Figure 6:
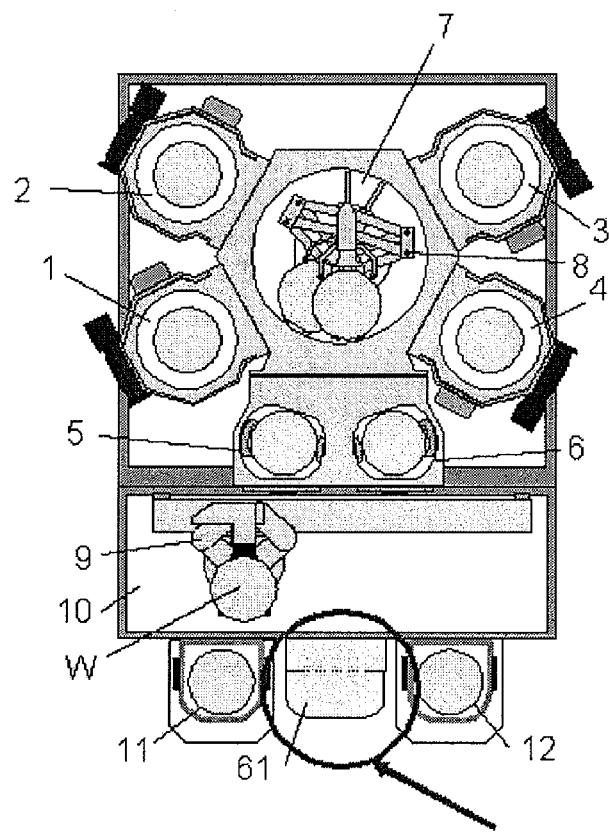

Next, regarding the method to integrate the semiconductor wafer in-line metrology module into the apparatus, it is possible to integrate this module into the apparatus shown in FIG. 1 at a position next to the atmospheric transfer robot 9 as shown in FIG. 5, or between the load ports 11, 12 as shown in FIG. 6, to inspect semiconductor wafers that have been processed in the semiconductor wafer reaction chambers 1-4 (in the figure, the semiconductor wafer in-line metrology module is indicated by a circle).

However, integrating the semiconductor wafer in-line metrology module in either of the aforementioned positions requires processed semiconductor wafers to be transferred to the semiconductor wafer in-line metrology module by means of the atmospheric transfer robot 9. As a result, an extra time is needed to transfer semiconductor wafers, which is not required on the original semiconductor manufacturing apparatus, and this reduces the throughput.

Figure 7:
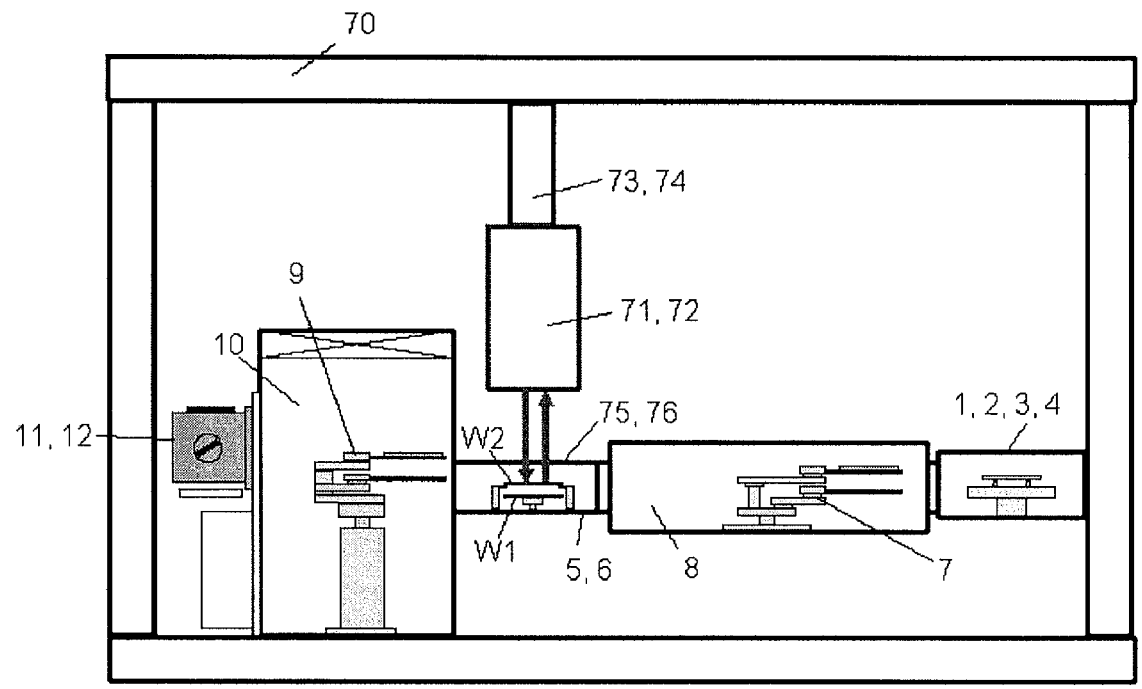
FIG. 7 is a schematic side view showing an example of a semiconductor manufacturing apparatus wherein semiconductor inspection modules are disposed above the wafer input/output (I/O) chamber according to an embodiment of the present invention.
Figure 8:
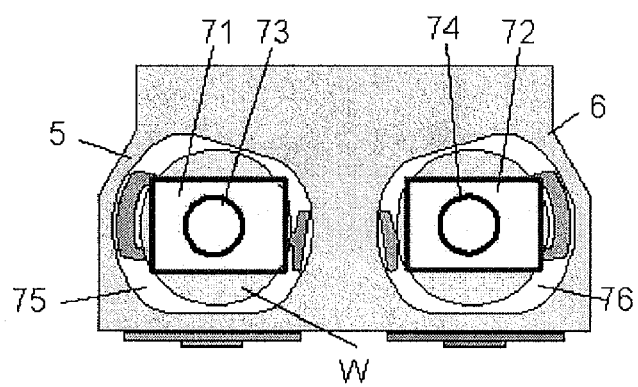
FIG. 8 is a schematic plan view showing the semiconductor inspection modules disposed above the wafer I/O chamber shown in FIG. 7 according to an embodiment of the present invention.

To address this problem, in an embodiment of the present invention a frame 70 is fabricated around the semiconductor manufacturing apparatus, as shown in FIG. 7, and the semiconductor wafer in-line metrology modules 71, 72 are installed from above the frame 70 at locations directly above the semiconductor wafer input/output chambers 5, 6 via supports 73, 74. FIG. 8 shows a top view of the semiconductor wafer input/output part alone (since two semiconductor wafer input/output chambers 5, 6 are provided in this embodiment, two semiconductor wafer in-line metrology modules 71, 72 are also available). The semiconductor wafer in-line metrology modules 71, 72 can be configured in such a way that only the optical head 45, among all inspection components, is installed inside the module, which helps reduce the size further. The semiconductor wafer in-line metrology modules 71, 72 are installed this way for the reasons explained below:

1) Clear glasses 75, 76 are used in the top portion of the semiconductor wafer input/output chambers 5, 6 to facilitate maintenance and for other purposes, and the light output from the semiconductor wafer in-line metrology modules and reflected light transmit the glass directly. In other words, an apparatus having these semiconductor wafer input/output chambers with clear glass allows for direct inspection of semiconductor wafers in the semiconductor wafer input/output chambers 5, 6 using the semiconductor wafer in-line metrology modules without adding any modification at all. By the way, the clear glass of the semiconductor wafer input/output chamber shown in FIG. 8 is large enough to view the semiconductor wafer in its entirety, but the size and shape of the clear glass (any other material can be selected, without limitation, as long as the material can transmit inspection light and withstand pressure change) are not limited in any way as long as the semiconductor wafer in-line metrology module can inspect the semiconductor wafers in the semiconductor wafer input/output chamber. The thickness of this clear glass is normally in a range of approx. 10 to 30 mm, such as approx. 20 mm.

2) The semiconductor wafer input/output chambers 5, 6 shown in FIG. 7 have a two-level structure where the semiconductor wafer W1 loaded into the chamber by the atmospheric transfer robot 9 is placed in the bottom level, while the semiconductor wafer W2 returned to the chamber by the vacuum transfer robot 7 after its processing is placed in the top level so that the semiconductor wafer W2 can be inspected via the clear glass. However, the semiconductor wafer input/output chamber does not have to have a two-level structure, and it can also have only a single level.

3) The internal pressure levels of the semiconductor wafer input/output chambers 5, 6 switch between atmospheric pressure and vacuum frequently. This is because when semiconductor wafers are transferred by the atmospheric transfer robot 9, the semiconductor wafer input/output chambers 5, 6 need to be in an atmospheric pressure state, while the semiconductor wafer input/output chambers 5, 6 needs to be in a vacuum state when semiconductor wafers are transferred by the vacuum transfer robot 7. To control the pressures, gate valves are provided between the semiconductor wafer input/output chambers 5, 6 and semiconductor wafer handling chamber 8, and also between the semiconductor wafer input/output chambers 5, 6 and a mini-environment 10. Once a semiconductor wafer that has been processed in one of the semiconductor wafer reaction chambers 1-4 is returned to either of the semiconductor wafer input/output chambers 5, 6, the applicable semiconductor wafer input/output chamber 5 or 6 needs to switch itself from a vacuum state to atmospheric pressure state in preparation for transfer of the semiconductor wafer by the atmospheric transfer robot in the next step. Normally, it takes some time to switch the pressure in the semiconductor wafer input/output chamber 5 or 6 at this time. Although the specific time varies depending on the volume of the applicable semiconductor wafer input/output chamber 5 or 6, with some apparatuses approx. 10 seconds will be needed. If the inspection time required by the semiconductor wafer in-line metrology modules 71, 72 is no more than 10 seconds, semiconductor wafers can be inspected without affecting in any way the normal semiconductor wafer processing operation time of the semiconductor manufacturing apparatus.

4) For example, one semiconductor wafer can be measured in just 2 seconds or so using the aforementioned IsTMS thickness measuring system by TEVET. This means that the normal operation time of the semiconductor manufacturing apparatus will not be affected because the inspection time is no more than 10 seconds, as explained above, and thus semiconductor wafers can be inspected without reducing the throughput at all.

5) By equipping the semiconductor wafer in-line metrology module with an auto-focus function, inspection can be performed even when the semiconductor wafer in-line metrology module is positioned away from the semiconductor wafer in the semiconductor wafer input/output chamber (in an embodiment, the distance from the semiconductor wafer in-line metrology module to the semiconductor wafer in the semiconductor wafer input/output chamber is in a range of approx. 50 to 250 mm, such as approx. 200 mm).

Figure 9:
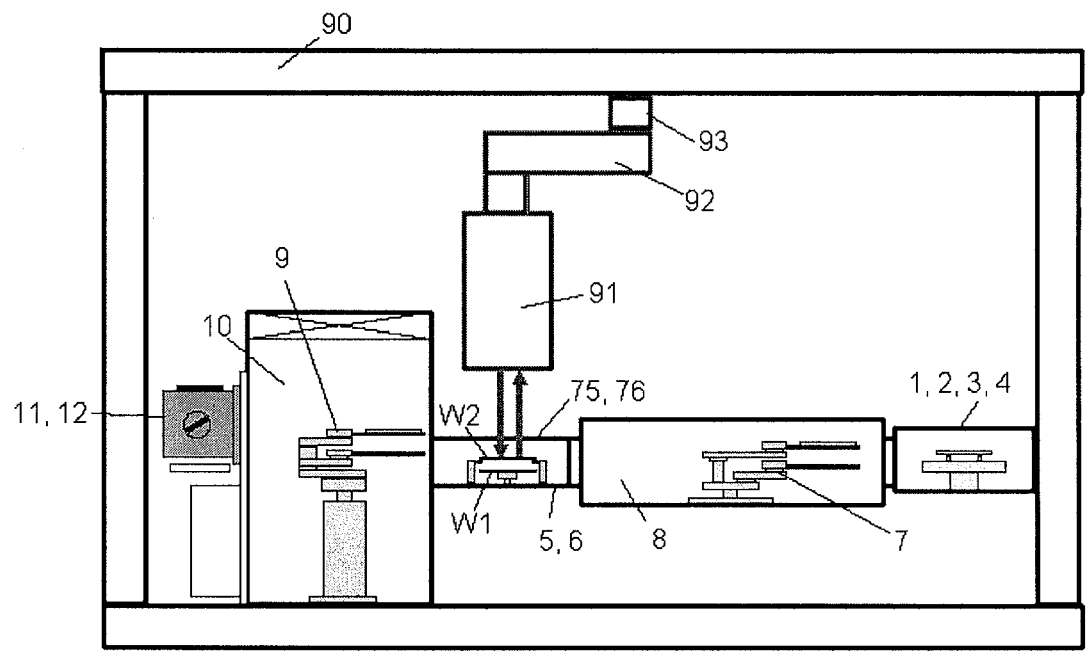
FIG. 9 is a schematic side view showing an example of a semiconductor manufacturing apparatus wherein a semiconductor inspection module having a rotation mechanism disposed above the wafer I/O chamber according to an embodiment of the present invention.

6) After a semiconductor wafer has been inspected and found "defective," it should be detected as soon as possible. This is because if the system is configured in such a way that upon detecting a defect the information is sent to the main controller of the semiconductor manufacturing apparatus, manufacturing of a defective semiconductor wafer in the subsequent processings can be prevented. From this viewpoint, it is desirable that the semiconductor wafer in-line metrology module be installed directly above the semiconductor wafer input/output chamber at a position upstream of the atmospheric transfer robot as shown in FIG. 7 or 9, instead of near the atmospheric transfer robot as shown in FIG. 5 or 6. Needless to say, the possibility of a considerable number of defective semiconductor wafers being manufactured will become high when the semiconductor inspection apparatus and semiconductor manufacturing apparatus are separate and thus semiconductor wafers are inspected after they have been transferred out of the semiconductor manufacturing apparatus.

Here, in an embodiment it is preferable for the main controller of the semiconductor manufacturing apparatus to detect returning of a processed semiconductor wafer to the semiconductor wafer input/output chamber and use this event as a trigger to start measurement. It is not always necessary to integrate the control of the semiconductor wafer in-line metrology module into the controller of the semiconductor manufacturing apparatus to perform automatic control, and it is also possible to have the semiconductor wafer in-line metrology module itself detect returning of a processed semiconductor wafer to the semiconductor wafer input/output chamber (such as by providing a separate optical sensor or using the thickness measuring light as an optical sensor to allow the module to detect input/output of a semiconductor wafer), so that the semiconductor wafer in-line metrology module can be operated independently from the control of the semiconductor manufacturing apparatus.

Figure 11:
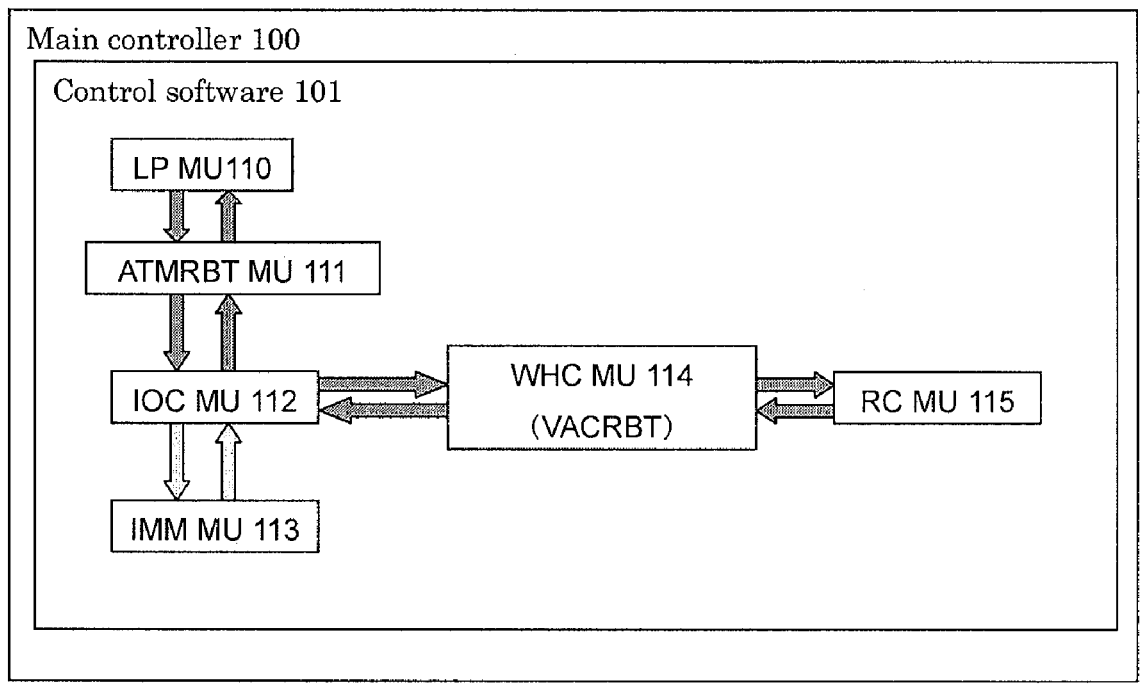
FIG. 11 is a schematic diagram showing apparatus control flow including control on an in line metrology module (IMM), such as the IsTMS module, according to an embodiment of the present invention.

FIG. 11 shows an embodiment where a semiconductor wafer in-line metrology module is integrated into a main controller 100 of a semiconductor manufacturing apparatus. The main controller 100 contains apparatus control software 101, and the apparatus control software 101 controls each chamber and robot to manage a series of operations. To be specific, the software controls and manages a series of operations by enabling communication between a load port management unit (LP MU) 110 and an atmospheric transfer robot management unit (ATMRBT MU) 111, between the atmospheric transfer robot management unit 111 and a semiconductor wafer input/output chamber management unit (IOC MU) 112, between the semiconductor wafer input/output chamber management unit 112 and a semiconductor wafer handling chamber management unit (WHC MU) 114 (vacuum robot management unit), and between the semiconductor wafer handling chamber management unit 114 (vacuum robot management unit) and a semiconductor wafer reaction chamber management unit (RC MU) 115. Here, a semiconductor wafer in-line metrology module management unit (IMM MU) 113 detects returning of a semiconductor wafer to the semiconductor wafer input/output chamber and uses this event as a trigger to operate the semiconductor wafer in-line metrology module to start inspection, and also establishes communication between the semiconductor wafer in-line metrology module management unit 113 and semiconductor wafer input/output chamber management unit 112 to notify the semiconductor wafer input/output chamber management unit 112 that the inspection has been done. By the way, the system can be configured in such a way that if an abnormality is detected as a result of inspection, the semiconductor wafer in-line metrology module management unit 113 outputs a signal to the main controller 100 to issue a warning for the abnormality or stop the processing.

Figure 10:
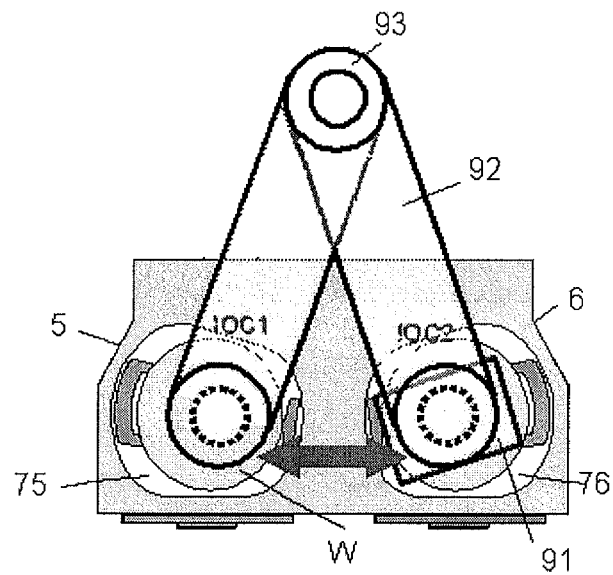
FIG. 10 is a schematic plane view showing the semiconductor inspection module disposed above the wafer I/O chamber shown in FIG. 9 according to an embodiment of the present invention.

Also in the embodiment illustrated in FIGS. 7 and 8, two semiconductor wafer in-line metrology modules 71, 72 are installed according to the number of semiconductor wafer input/output chambers 5, 6 provided (two). However, this structure adds to cost. To address this problem, only one semiconductor wafer in-line metrology module 91 is used in another embodiment illustrated in FIGS. 9 and 10. A frame 90 is fabricated around the semiconductor manufacturing apparatus and the semiconductor wafer in-line metrology module 91 is installed from above the frame 90 at a location directly above the semiconductor wafer input/output chambers 5, 6, which is the same as in the embodiment shown in FIG. 7. The difference is that moving parts 92, 93, specifically rotating mechanisms, are provided in the location where the semiconductor wafer in-line metrology module 91 is installed from above the frame 90. FIG. 9 provides a side view of this structure, while FIG. 10 provides a top view. The moving parts 92, 93, connected to the semiconductor wafer in-line metrology module, move between the two semiconductor wafer input/output chambers 75, 76, or IOC1 and IOC2, by means of a rotating mechanism, to allow for inspection in each chamber.

Figure 12:
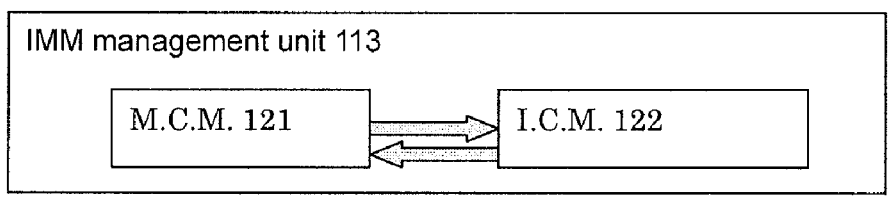
FIG. 12 is a schematic diagram showing IMM control flow according to an embodiment of the present invention.

Here, the main controller 100 of the semiconductor manufacturing apparatus needs to implement a control whereby the semiconductor wafer in-line metrology module 91 is moved to above the semiconductor input/output chamber (5 or 6) to which a processed semiconductor wafer has been returned. Another control is also needed whereby completion of movement of the semiconductor wafer in-line metrology module 91 is detected and this event is used as a trigger to start inspection. FIG. 12 illustrates these controls. Although the semiconductor wafer in-line metrology module management unit 113 communicates with the semiconductor wafer input/output chamber management unit 112, just like in the embodiment illustrated in FIG. 11, in this embodiment where the moving parts 92, 93 are used the control of these moving parts 92, 93 and control of inspection are managed by the semiconductor wafer in-line metrology module management unit 113. To be specific, the semiconductor wafer in-line metrology module management unit 113 has a movement control management unit (MCM) 121 and an inspection control management unit (ICM) 122, as shown in FIG. 12, and these two units communicate with each other. This way, the movement control management unit 121 detects completion of operation of the moving parts 92, 93 and sends this event to the inspection control management unit 122 to start inspection of semiconductor wafer.

Take note that although the entire semiconductor wafer in-line metrology module is moved in the illustrated example, it is also possible to laterally move only the optical head 45 shown in FIG. 4 and fix all other components on top of the frame.

Although the aforementioned example explained a case where two semiconductor wafer in-line metrology modules are installed in line with two semiconductor wafer input/output chambers, the number of semiconductor wafer input/output chambers is not limited to two. In the case of a semiconductor manufacturing apparatus having N number of semiconductor wafer input/output chambers, of course N number of semiconductor wafer in-line metrology modules can be installed to achieve the same effect as mentioned above.

Similarly, it is also possible, in a semiconductor manufacturing apparatus having N number of semiconductor wafer input/output chambers, to move one semiconductor wafer in-line metrology module by means of a rotating mechanism to allow inspection of semiconductor wafers to be conducted in the respective semiconductor wafer input/output chambers.

Based on the above, a semiconductor manufacturing apparatus having a semiconductor wafer in-line metrology module above a semiconductor wafer input/output chamber, designed in conformance to an embodiment of the present invention, can inspect semiconductor wafers without increasing the inherent processing time of the semiconductor manufacturing apparatus, i.e., without reducing the throughput of the semiconductor manufacturing apparatus at all. Such semiconductor manufacturing apparatus can also inspect semiconductor wafers without necessitating an increase in footprint.

In the present disclosure where conditions and/or structures are not specified, the skilled artisan in the art can readily provide such conditions and/or structures, in view of the present disclosure, as a matter of routine experimentation.

The present invention includes the above mentioned embodiments and other various embodiments including the following:

1) A semiconductor manufacturing apparatus comprising a semiconductor wafer input/output chamber, a semiconductor wafer in-line metrology module, a semiconductor wafer reaction chamber and a controller, said semiconductor manufacturing apparatus characterized in that the semiconductor wafer in-line metrology module is installed above the semiconductor wafer input/output chamber to inspect the semiconductor wafers in the semiconductor wafer input/output chamber.

2) A semiconductor manufacturing apparatus according to 1) above, wherein the semiconductor wafer in-line metrology module inspects the semiconductor wafers in the semiconductor wafer input/output chamber while the pressure in the semiconductor wafer input/output chamber is changing.

3) A semiconductor manufacturing apparatus according to 2) above, wherein the semiconductor wafer in-line metrology module inspects the semiconductor wafers in the semiconductor wafer input/output chamber while the pressure in the semiconductor wafer input/output chamber is changing from a low level to high level.

4) A semiconductor manufacturing apparatus according to 1) above, wherein the controller implements a control whereby returning to the semiconductor wafer input/output chamber of a semiconductor wafer that has been processed in the semiconductor wafer reaction chamber is detected and this information is used as a trigger to start inspection by the semiconductor wafer in-line metrology module.

5) A semiconductor manufacturing apparatus comprising at least two semiconductor wafer input/output chambers, at least two semiconductor wafer in-line metrology modules, a semiconductor wafer reaction chamber and a controller, said semiconductor manufacturing apparatus characterized in that the semiconductor wafer in-line metrology modules provided in the same number as the semiconductor wafer input/output chambers are installed above the multiple semiconductor wafer input/output chambers to inspect the semiconductor wafers in the semiconductor wafer input/output chambers.

6) A semiconductor manufacturing apparatus according to 5) above, wherein the semiconductor wafer in-line metrology modules inspect the semiconductor wafers in the semiconductor wafer input/output chambers while the pressures in the semiconductor wafer input/output chambers are changing.

7) A semiconductor manufacturing apparatus according to 5) above, wherein the semiconductor wafer in-line metrology modules inspect the semiconductor wafers in the semiconductor wafer input/output chambers while the pressures in the semiconductor wafer input/output chambers are changing from a low level to high level.

8) A semiconductor manufacturing apparatus according to 5) above, wherein the controller implements a control whereby returning to one of the semiconductor wafer input/output chambers of a semiconductor wafer that has been processed in the semiconductor wafer reaction chamber is detected and this information is used as a trigger to start inspection by one of the semiconductor wafer in-line metrology modules.

9) A semiconductor manufacturing apparatus comprising at least two semiconductor wafer input/output chambers, a semiconductor wafer in-line metrology module, moving parts that move the semiconductor wafer in-line metrology module in the rotating direction, a semiconductor wafer reaction chamber and a controller, said semiconductor manufacturing apparatus characterized in that the semiconductor wafer in-line metrology module moves above the multiple semiconductor wafer input/output chambers to inspect the semiconductor wafers in the respective semiconductor wafer input/output chambers.

10) A semiconductor manufacturing apparatus according to 9) above, wherein the semiconductor wafer in-line metrology module inspects the semiconductor wafers in the wafer input/output chambers while the pressures in the semiconductor wafer input/output chambers are changing.

11) A semiconductor manufacturing apparatus according to 9) above, wherein the semiconductor wafer in-line metrology module inspects the semiconductor wafers in the semiconductor wafer input/output chambers while the pressures in the semiconductor wafer input/output chambers are changing from a low level to high level.

12) A semiconductor manufacturing apparatus according to 9) above, wherein the controller implements a control whereby returning to one of the semiconductor wafer input/output chambers of a semiconductor wafer that has been processed in the semiconductor wafer reaction chamber is detected and this information is used as a trigger to start operation of the moving parts in the direction of the semiconductor wafer input/output chamber in which the applicable semiconductor wafer is present.

13) A semiconductor manufacturing apparatus according to 12) above, wherein the controller implements a control whereby completion of operation of the moving parts is detected and this information is used as a trigger to start inspection by the semiconductor wafer in-line metrology module.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor manufacturing apparatus comprising:
a processing unit for processing at least one wafer;
a loading/unloading unit for loading/unloading at least one wafer;
an input/output chamber for taking inside a processed wafer from the processing unit and taking out the processed wafer to the loading/unloading unit, and taking inside an unprocessed wafer from the loading/unloading unit and taking out the unprocessed wafer to the processing unit, said input/output chamber being evacuatable and having a top portion through which light is transmittable; and
a wafer inspection device disposed outside the input/output chamber for inspecting the processed wafer through the top portion of the input/output chamber while the processed wafer is temporarily placed in the input/output chamber.

2. The semiconductor manufacturing apparatus according to claim 1, wherein the wafer inspection device is disposed above the light transmittable top portion of the input/output chamber.

3. The semiconductor manufacturing apparatus according to claim 2, wherein the wafer inspection device is disposed right above the top portion, through which light is transmittable, of the input/output chamber.

4. The semiconductor manufacturing apparatus according to claim 1, wherein the wafer inspection device is suspended above the top portion, through which light is transmittable, of the input/output chamber.

5. A semiconductor manufacturing apparatus comprising:
a processing unit for processing at least one wafer;
a loading/unloading unit for loading/unloading at least one wafer;
an input/output chamber for taking inside a processed wafer from the processing unit and taking out the processed wafer to the loading/unloading unit, and taking inside an unprocessed wafer from the loading/unloading unit and taking out the unprocessed wafer to the processing unit, said input/output chamber having a top portion through which light is transmittable; and
a wafer inspection device for inspecting the processed wafer through the top portion of the input/output chamber while the processed wafer is temporarily placed in the input/output chamber,
wherein the input/output chamber comprises a load lock chamber.

6. The semiconductor manufacturing apparatus according to claim 5, wherein the wafer inspection device is an optical inspection device for optically measuring thickness of a film formed on the processed wafer.

7. The semiconductor manufacturing apparatus according to claim 5, wherein the wafer inspection device is an integrated metrology module programmed to inspect the processed wafer while the pressure inside the input/output chamber changes.

8. The semiconductor manufacturing apparatus according to claim 7, wherein the integrated metrology module is programmed to inspect the processed wafer while the pressure inside the input/output chamber rises from reduced pressure.

9. The semiconductor manufacturing apparatus according to claim 7, wherein the integrated metrology module is programmed to trigger inspection of the processed wafer when the processed wafer is taken into the input/output chamber from the processing unit.

10. The semiconductor manufacturing apparatus according to claim 5, further comprising another input/output chamber disposed next to the input/output chamber and another wafer inspection device disposed above the an other input/output chamber.

11. The semiconductor manufacturing apparatus according to claim 10, further comprising another input/output chamber disposed next to the input/output chamber, wherein the wafer inspection device is rotatable between a first position where the wafer inspection device is right above the input/output chamber and a second position where the wafer inspection device is right above the another input/output chamber.

12. The semiconductor manufacturing apparatus according to claim 11, wherein the wafer inspection device is an integrated metrology module programmed to trigger inspection of the processed wafer when the integrated metrology module moves to the first position or the second position.

13. The semiconductor manufacturing apparatus according to claim 5, wherein the processing unit comprises a wafer handling chamber connected to the input/output chamber, and at least one reaction chamber connected to the handling chamber, said wafer handling chamber being provided with a vacuum transfer robot for transferring wafers between the at least one reaction chamber and the input/output chamber.

14. The semiconductor manufacturing apparatus according to claim 5, wherein the loading/unloading unit comprises at least one wafer cassette and a mini-environment is provided between the input/output chamber and the loading/unloading unit, said mini-environment being provided with an atmospheric transfer robot for transferring wafers between the input/output chamber and the loading/unloading unit.

* * * * *

UNITED STATES PATENT AND TRADEMARK OFFICE
CERTIFICATE OF CORRECTION

PATENT NO. : 7,832,353 B2
APPLICATION NO. : 12/198004
DATED : November 16, 2010
INVENTOR(S) : Takizawa et al.

It is certified that error appears in the above-identified patent and that said Letters Patent is hereby corrected as shown below:

At column 5, line 59, after "employed" insert --.--.

At column 14, line 16, in Claim 11, change "claim 10," to --claim 5,--.

Signed and Sealed this
Fourteenth Day of June, 2011

David J. Kappos
*Director of the United States Patent and Trademark Office*